United States Patent
Chae et al.

(10) Patent No.: US 7,548,124 B2
(45) Date of Patent: Jun. 16, 2009

(54) SYSTEM AND METHOD FOR SELF CALIBRATING VOLTAGE-CONTROLLED OSCILLATOR

(75) Inventors: Hyun Soo Chae, Seoul (KR); Jung Eun Lee, Yongin-si (KR); Chun Deok Suh, Yongin-si (KR); Hoon Tae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 11/586,655

(22) Filed: Oct. 26, 2006

(65) Prior Publication Data

US 2007/0249293 A1     Oct. 25, 2007

(30) Foreign Application Priority Data

Apr. 21, 2006 (KR) ...................... 10-2006-0036188

(51) Int. Cl.
*H03L 7/113* (2006.01)
(52) U.S. Cl. .............................. 331/44; 331/16; 331/11; 331/179; 327/157
(58) Field of Classification Search .................. 331/10, 331/11, 16, 17, 34, 44, 179; 327/156, 157; 375/376; 455/255, 257, 258, 260
See application file for complete search history.

(56) References Cited

U.S. PATENT DOCUMENTS

| 6,552,618 | B2 * | 4/2003 | Nelson et al. ................. 331/11 |
| 6,683,502 | B1 * | 1/2004 | Groen et al. ................... 331/17 |
| 7,230,505 | B2 * | 6/2007 | Rachedine et al. .......... 331/179 |
| 2002/0070761 | A1 * | 6/2002 | Abbiate et al. ................ 327/48 |

FOREIGN PATENT DOCUMENTS

WO   WO 2004/004126 A1   1/2004

OTHER PUBLICATIONS

Wilson et al., "A CMOS Self-Calibrating Frequency Synthesizer", Oct. 2000, IEEE Journal of Solid-State Circuits, vol. 35, No. 10, pp. 1437-1444.*

* cited by examiner

*Primary Examiner*—Robert Pascal
*Assistant Examiner*—Ryan J. Johnson
(74) *Attorney, Agent, or Firm*—Sughrue Mion, PLLC

(57) ABSTRACT

A system and a method for self calibrating a voltage-controlled oscillator (VCO). In the system, a mode controller generates a control signal for each of an automatic band selection mode, an automatic gain tuning mode, and a phase-locking mode, from a frequency comparison result between a reference clock signal and a divided clock signal which is generated by dividing a frequency of an oscillation signal, and thereby controls the VCO, so that the VCO may generate the oscillation signal which is automatically phase-locked in a target frequency with an optimal state.

20 Claims, 11 Drawing Sheets

SYSTEM AND METHOD FOR SELF CALIBRATING VOLTAGE-CONTROLLED OSCILLATOR

CROSS-REFERENCE TO RELATED APPLICATION

This application claims priority from Korean Patent Application No. 10-2006-0036188, filed on Apr. 21, 2006, in the Korean Intellectual Property Office, the entire disclosure of which is incorporated herein by reference.

BACKGROUND OF THE INVENTION

1. Field of the Invention

The present invention relates to a phase-locked loop (PLL) system, and more particularly, to a PLL system which can generate a signal that automatically oscillates in a target frequency with an optimal state by controlling a band selection, a gain tuning, and a phase locking of a voltage-controlled oscillator (VCO), and a method of using the PLL system.

2. Description of Related Art

FIG. 1 is a block diagram illustrating a conventional phase-locked loop (PLL) system 100. Referring to FIG. 1, the PLL system 100 includes a phase/frequency detector (PFD) 110, a charge pump 120, a loop filter 130, a voltage-controlled oscillator (VCO) 140, and a frequency divider 150. The PLL system 100 receives a reference clock signal REF, and generates an oscillation signal LO which is phase-locked with the reference clock signal REF. In this case, the oscillation signal LO has a frequency that is acquired by multiplying a frequency of the reference clock signal REF by N times.

The conventional PLL system 100 functions to multiply the reference clock signal REF by a predetermined division ratio. Also, the conventional PLL system is widely utilized for generating a clock signal and recovering a clock and data.

The mismatch between the simulation and measurement in designing VCO resulting from process variations requires wide band VCOs which can sufficiently compensate the process variations. Also, to support multi-band and multi-mode wireless communication standards, it is indispensable to design wide band VCOs.

When designing the VCO 140 which oscillates in a broader frequency band, an operating frequency band of the VCO 140 is divided into several bands, so that gain features of the VCO 140 are not enormously enlarged. In this case, a band containing a target frequency must be selected from the several bands, so as to generate a frequency which is required in a system. However, when a user selects the band via a manual manipulation, it is very disadvantageous in aspects of time and costs. Accordingly, technologies for selecting a band via an automatic operation have been introduced.

Also, the gain features of the VCO 140 are not the same for each band. Accordingly, since a loop operating characteristic of the designed PLL circuit may be distorted, a gain adjustment function is required in addition to an automatic band selection function.

SUMMARY OF THE INVENTION

The present invention provides a phase-locked loop (PLL) system which can generate a stable oscillation signal by sequentially operating an automatic band selection mode, an automatic gain tuning mode, and a phase-locking mode, so that a frequency band and a gain feature, which are required in a system, are automatically selected from feature curves of a voltage-controlled oscillator (VCO) having a plurality of frequency bands and gain features.

The present invention also provides a method which can phase-lock an oscillation signal of a target frequency in a central voltage of a tuning voltage range, and thereby, can generate an oscillation signal to secure an optimal phase noise feature and stability.

According to an aspect of the present invention, a system for generating an oscillation signal includes: a VCO which generates an oscillation signal according to a control signal of each of a plurality of modes; and a mode controller which generates the control signal of each of the plurality of modes from a frequency comparison result between a first clock signal, and a second clock signal which is generated by dividing a frequency of the oscillation signal.

According to another aspect of the present invention, a system for generating an oscillation signal includes: a VCO which generates the oscillation signal corresponding to an oscillation-controlled voltage, in a frequency band which is selected according to a band-adjusted digital value, and a gain range which is selected according to a gain-adjusted digital value; a mode determination unit which compares a value of a frequency comparison result and predetermined threshold values to generate a mode selection signal, from the frequency comparison result between a first clock signal, and a second clock signal which is generated by dividing a frequency of the oscillation signal; a switch which switches a sign of the frequency comparison result to any one of a first path and a second path according to a mode selection signal, and outputs any one of a first voltage, a second voltage, and a phase-locked loop (PLL) based variable voltage, as the oscillation-controlled voltage according to the mode selection signal; a band controller which generates the band-adjusted digital value according to the sign of the frequency comparison result which is output to the first path; and a gain controller which generates the gain-adjusted digital value according to the sign of the frequency comparison result which is output to the second path.

According to still another aspect of the present invention, a system for generating an oscillation signal includes: a VCO which generates the oscillation signal corresponding to an oscillation-controlled voltage, in a frequency band which is selected according to a band-adjusted digital value, and a gain range which is selected according to a gain-adjusted digital value; a counter which compares a count value of pulses of a clock signal and predetermined periods, and generates a mode selection signal; a switch which switches a sign of a frequency comparison result between a first clock signal, and a second clock signal which is generated by dividing a frequency of the oscillation signal, to any one of a first path and a second path according to the mode selection signal, and outputs any one of a first voltage, a second voltage, and a PLL based variable voltage, as the oscillation-controlled voltage according to the mode selection signal; a band controller which generates the band-adjusted digital value according to the sign of the frequency comparison result which is output to the first path; and a gain controller which generates the gain-adjusted digital value according to the sign of the frequency comparison result which is output to the second path.

According to yet another aspect of the present invention, a method of generating an oscillation signal from a VCO includes: selecting an operating frequency band of the VCO; tuning a gain range of the VCO in the selected operating frequency band; and phase-locking the oscillation signal in the tuned gain range.

According to still another aspect of the present invention, a method of generating an oscillation signal using a VCO includes: generating a control signal for each of an automatic band selection mode, an automatic gain tuning mode, and a phase-locking mode of the VCO, from a frequency comparison result between a first clock signal, and a second clock signal which is generated by dividing a frequency of the oscillation signal; and generating the oscillation signal according to the control signal.

According to still another aspect of the present invention, a method of generating an oscillation signal corresponding to an oscillation-controlled voltage using a VCO in a frequency band which is selected according to a band-adjusted digital value, and a gain range which is selected according to a gain-adjusted digital value, includes: comparing a value of a frequency comparison result and predetermined thresholds to generate a mode selection signal, from the frequency comparison result between a first clock signal, and a second clock signal which is generated by dividing a frequency of the oscillation signal; switching a sign of the frequency comparison result to any one of a first path and a second path according to the mode selection signal; switching any one of a first voltage, a second voltage, and a PLL based variable voltage, to the oscillation-controlled voltage, according to the mode selection signal; generating the band-adjusted digital value according to the sign of the frequency comparison result which is output to the first path; and generating the gain-adjusted digital value according to the sign of the frequency comparison result which is output to the second path.

According to still another aspect of the present invention, a method of generating an oscillation signal corresponding to an oscillation-controlled voltage using a VCO in a frequency band which is selected by a band-adjusted digital value and a gain range which is selected according to a gain-adjusted digital value, includes: comparing a count value of pulses of a predetermined clock signal and predetermined periods to generate a mode selection signal; switching a sign of a frequency comparison result between a first clock signal and a second clock signal which is generated by dividing a frequency of the oscillation signal, to any one of a first path and a second path according to the mode selection signal; switching any one of a first voltage, a second voltage, and a PLL based variable voltage, as the oscillation-controlled voltage, according to the mode selection signal; generating the band-adjusted digital value according to the sign of the frequency comparison result which is output to the first path; and generating the gain-adjusted digital value according to the sign of the frequency comparison result which is output to the second path.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS OF THE INVENTION

Figure 1:
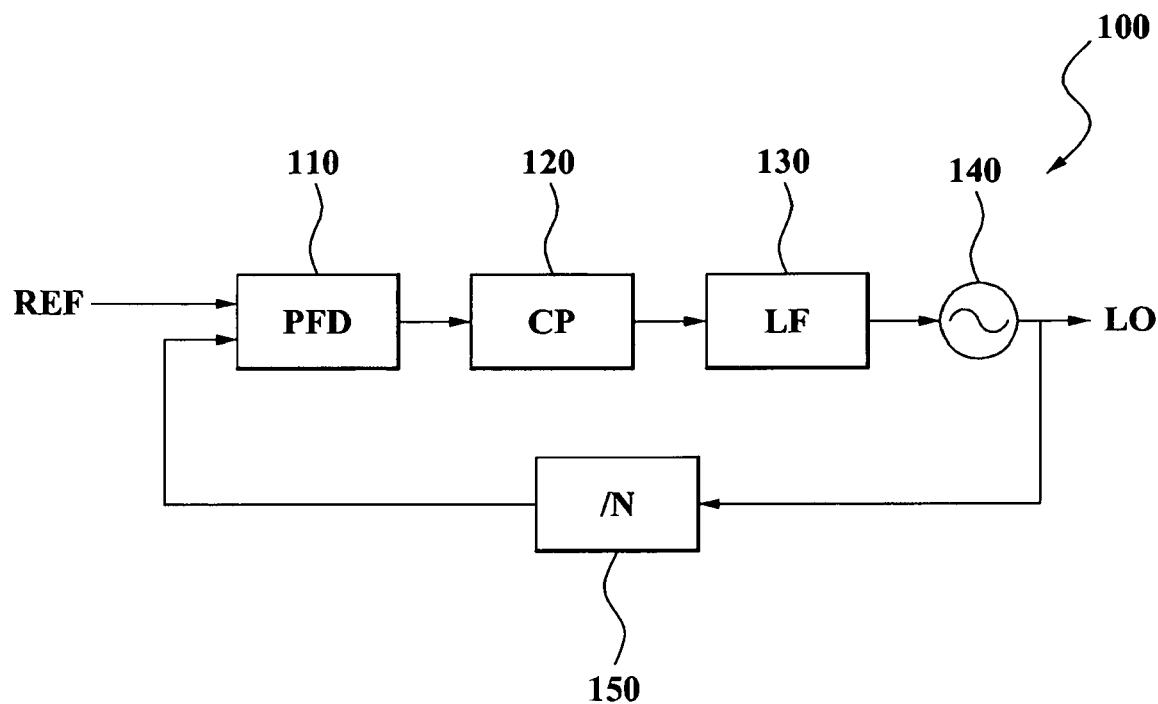
FIG. 1 is a block diagram illustrating a conventional PLL system.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 2:
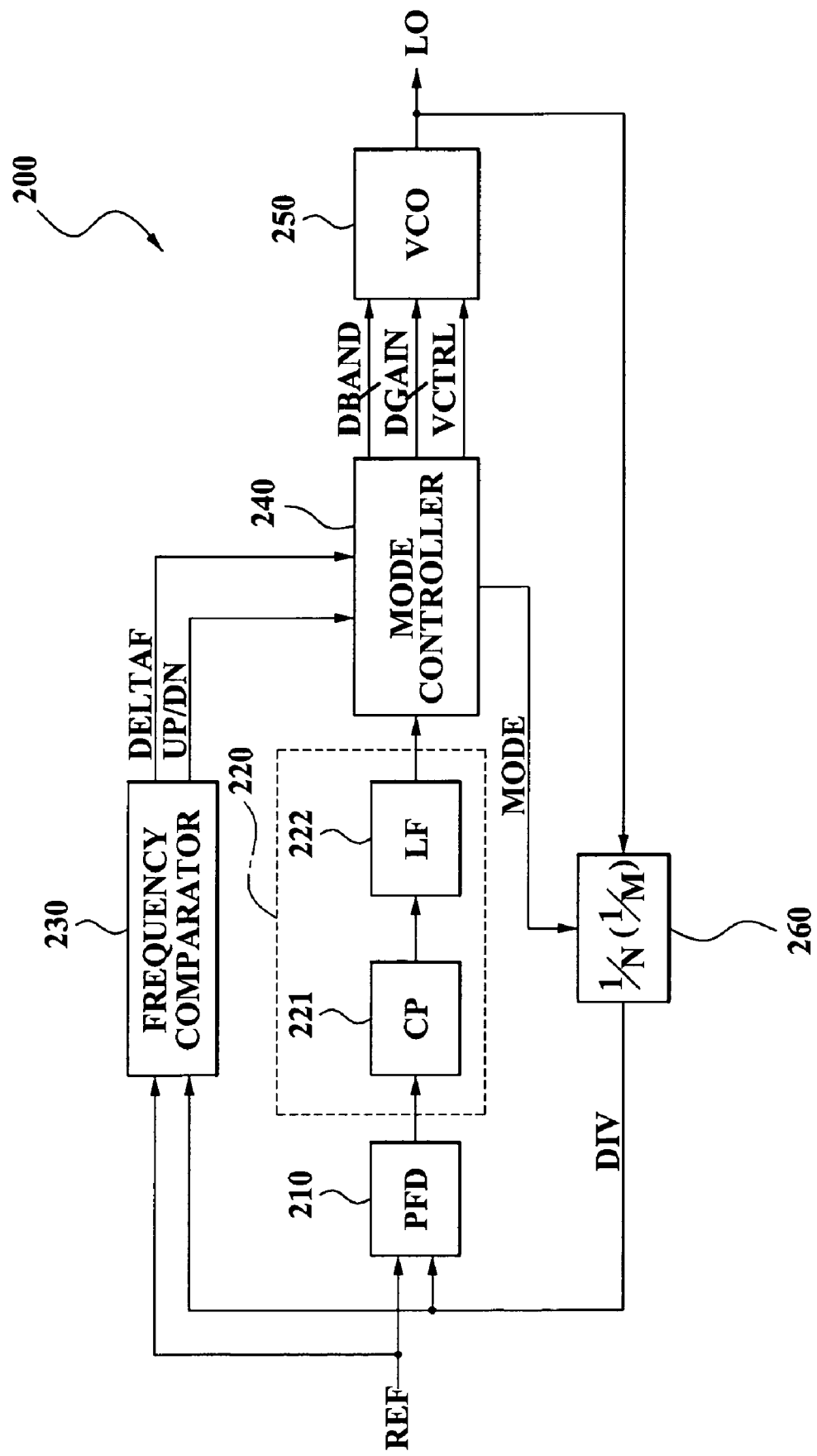
FIG. 2 is a block diagram illustrating a PLL system according to an exemplary embodiment of the present invention.

As shown in FIG. 2, a system for generating an oscillation signal according to the present invention may include, in addition to a conventional phase-locked loop (PLL) structure, a frequency comparator 230 and a mode controller 240. The mode controller 240 functions to select each of an automatic band selection mode, an automatic gain tuning mode, and a phase-locking mode. Also, the mode controller 240 functions to input a corresponding control signal into a voltage-controlled oscillator (VCO) 250, in a selected mode. Specifically, the mode controller 240 functions to input a band-adjusted control signal into the VCO 250 in the automatic band selection mode which is a first operation, to input a gain-adjusted control signal into the VCO 250 in the automatic gain tuning mode which is a second operation, and to supply a voltage, which is stored in a loop filter LF 222, to the VCO 250 in the phase-locking mode which is a third operation.

Figure 7:
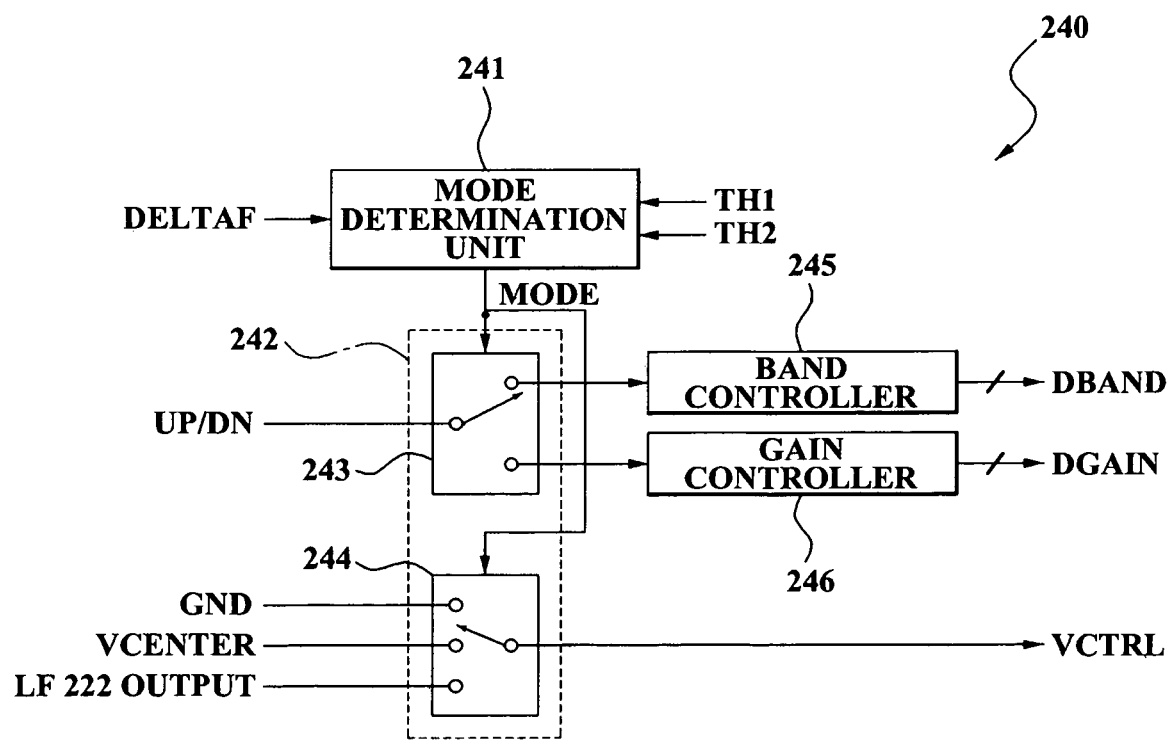
FIG. 7 is a block diagram illustrating an example of a mode controller shown in FIG. 2 according to an exemplary embodiment of the present invention.
Figure 11:
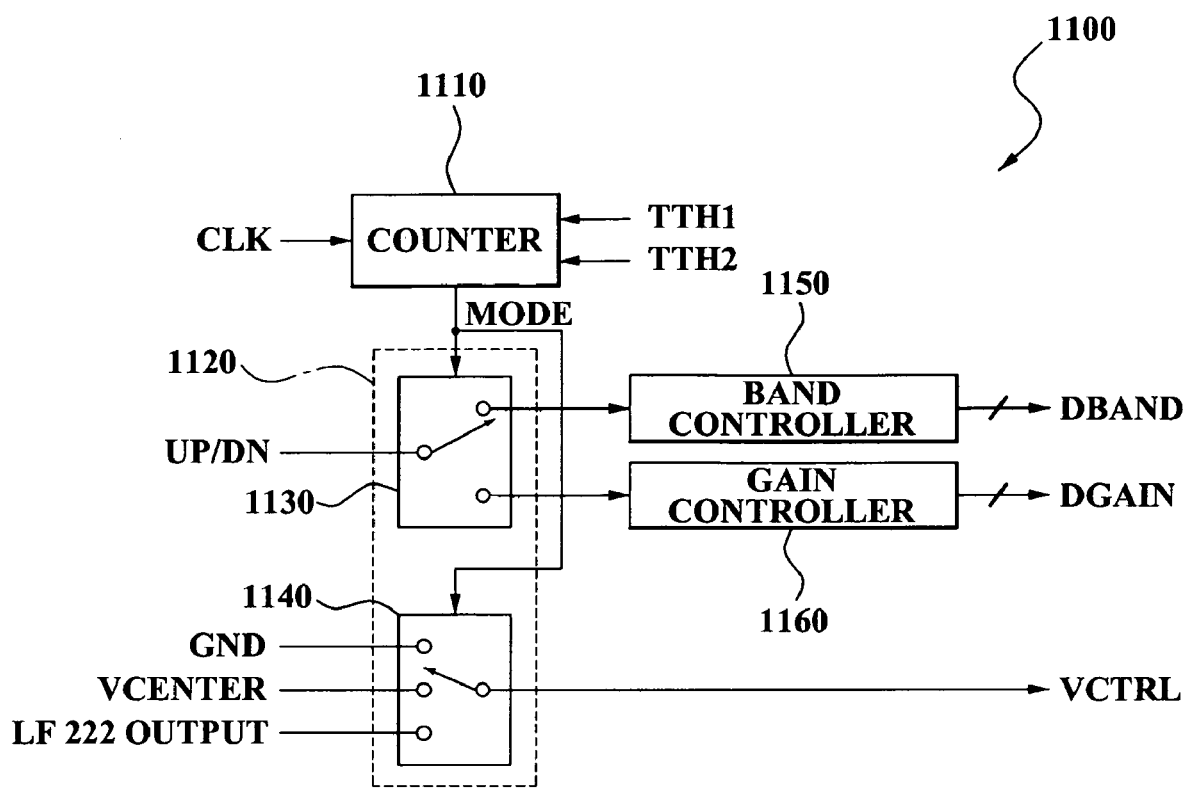
FIG. 11 is a block diagram illustrating an example of a mode controller according to another exemplary embodiment of the present invention.

The mode controller 240 may be embodied into two types of structures as shown in FIGS. 7 and 11 respectively. In FIG. 7, the mode controller 240 receives a frequency error DELTAF from the frequency comparator 230, and compares the received frequency error DELTAF with a threshold value which is set for each mode. The threshold value is set as TH1 for the automatic band selection mode, and set as TH2 for the automatic gain tuning mode. According to the comparison, the mode controller 240 may complete the automatic band selection mode and change to the automatic gain tuning mode. Also, the mode controller 240 may change from the automatic gain tuning mode to the phase-locking mode.

In FIG. 11, the frequency error DELTAF is not received. When a predetermined period of time, which is set for each mode, elapses, a mode controller may change from the automatic band selection mode to the automatic gain tuning mode. Also, the mode controller may change from the automatic gain tuning mode to the phase-locking mode. In this case, the predetermined period of time is set as TTH1 for the automatic band selection mode, and set as TTH2 for the automatic gain tuning mode. Also, TTH1 and TTH2 designate a significantly long period of time, for example, tens of μs, enough to successfully complete the automatic band selection operation and the automatic gain tuning operation, respectively.

A fixed value of the frequency error DELTAF must be measured to complete each mode operation and go to a next mode. Accordingly, in FIG. 7, while the frequency comparator 230 is required to be precisely designed, it will take less time to perform the three modes. Also, in FIG. 11, the frequency comparator 230 is required to detect only a polarity, for example, + or −, not the fixed value of the frequency error DELTAF. Accordingly, when designing the mode controller 1100 shown in FIG. 11, it may take a longer period of time to perform the three modes, but loads to the frequency comparator 230 may be reduced.

Hereinafter, a system operation for generating an oscillation signal according to an exemplary embodiment of the present invention will be described in detail with reference to FIGS. 2 through 13.

FIG. 2 is a block diagram illustrating a PLL system 200 according to an exemplary embodiment of the present invention. Referring to FIG. 2, the PLL system 200 includes a phase/frequency detector (PFD) 210, an oscillation-controlled voltage generator 220, a frequency comparator 230, a mode controller 240, a VCO 250, and a divider 260. The oscillation-controlled voltage generator 220 includes a charge pump CP 221 and a loop filter LF 222.

The PLL system 200 generates a stable oscillation signal LO by sequentially operating the VCO 250 in each of an automatic band selection mode, an automatic gain tuning mode, and a phase-locking mode. Accordingly, the PLL system 200 enables the oscillation signal LO to be stably phase-locked in a target frequency even when a change in a process condition or an operating temperature occurs. The PLL system 200 may be applied to a wireless communication system, such as a mobile phone, a Digital Multimedia Broadcasting (DMB) phone, a personal digital assistant (PDA), and the like, and may also improve system performance with respect to a broader frequency range. Also, the PLL system 200 may be constructed in a digital circuit.

Figure 3:
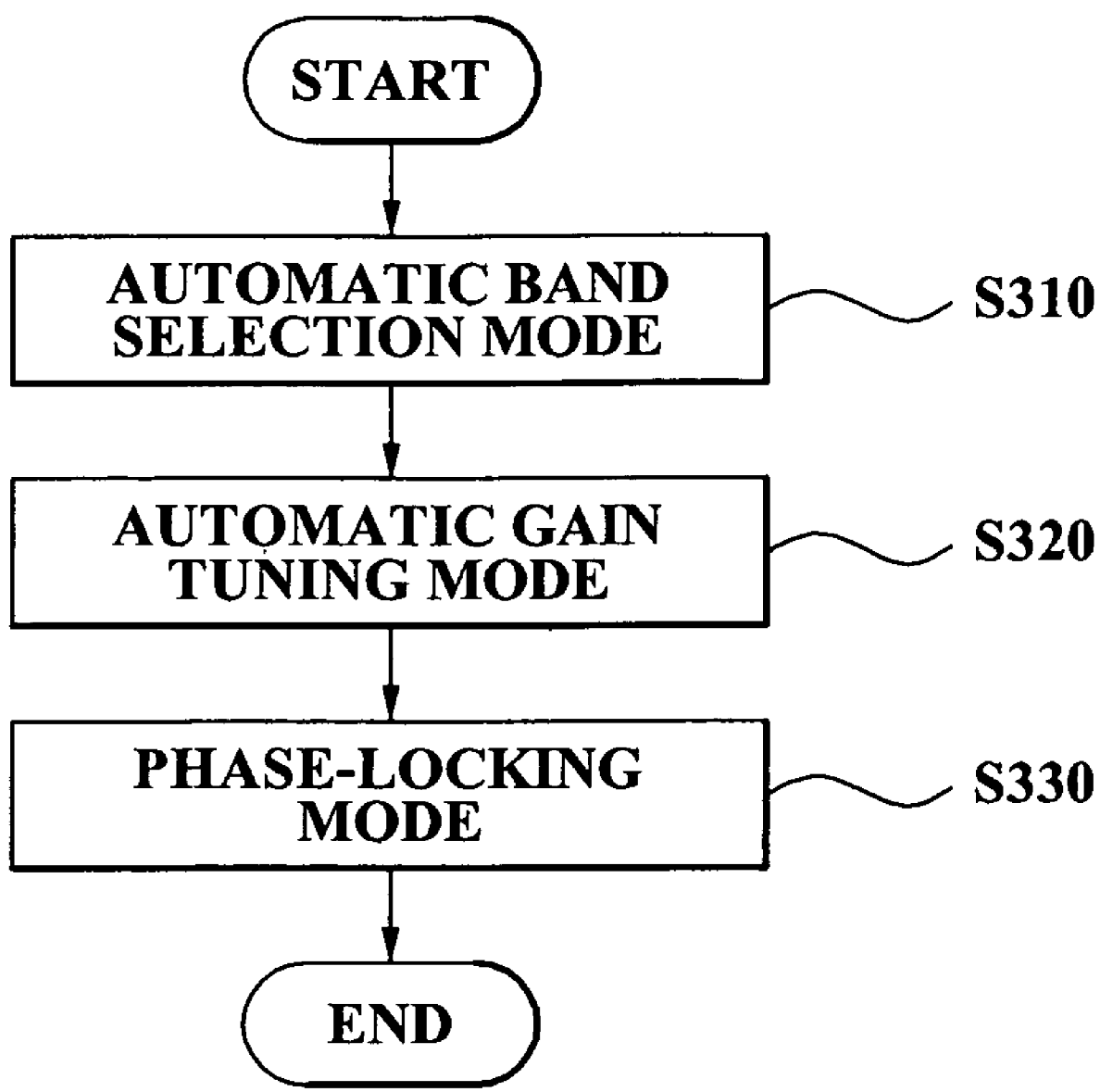
FIG. 3 is a diagram illustrating an example of performing three modes in a PLL system shown in FIG. 2 according to an exemplary embodiment of the present invention.
Figure 4:
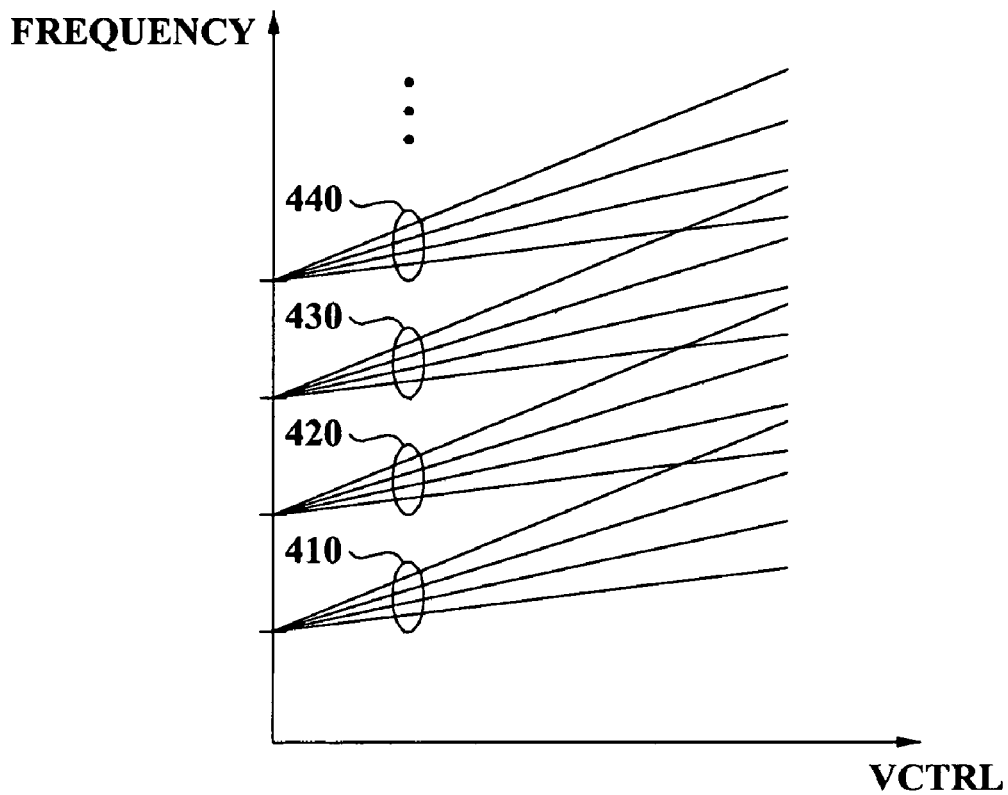
FIG. 4 is a graph illustrating an operating frequency band of a VCO shown in FIG. 2 according to an exemplary embodiment of the present invention.

As shown in FIG. 3, an automatic band selection mode S310, an automatic gain tuning mode S320, and a phase-locking mode S330 are sequentially operated. The mode controller 240 controls the automatic band selection mode S310, the automatic gain tuning mode S320, and the phase-locking mode S330. In the automatic band selection mode S310, any one of bands 410, 420, 430, 440, . . . , which are shown in operating frequency characteristics of the VCO 250 shown in FIG. 4, is selected. In the automatic gain tuning mode S320, a gain corresponding to any one target curve is selected from curves which are shown in the selected band. Also, in the phase-locking mode S330, the oscillation signal LO is phase-locked to a target frequency $f_{target}$ in a central voltage of a swing range of an oscillation-controlled voltage VCTRL of the VCO 250, as shown in FIG. 5.

Figure 5:
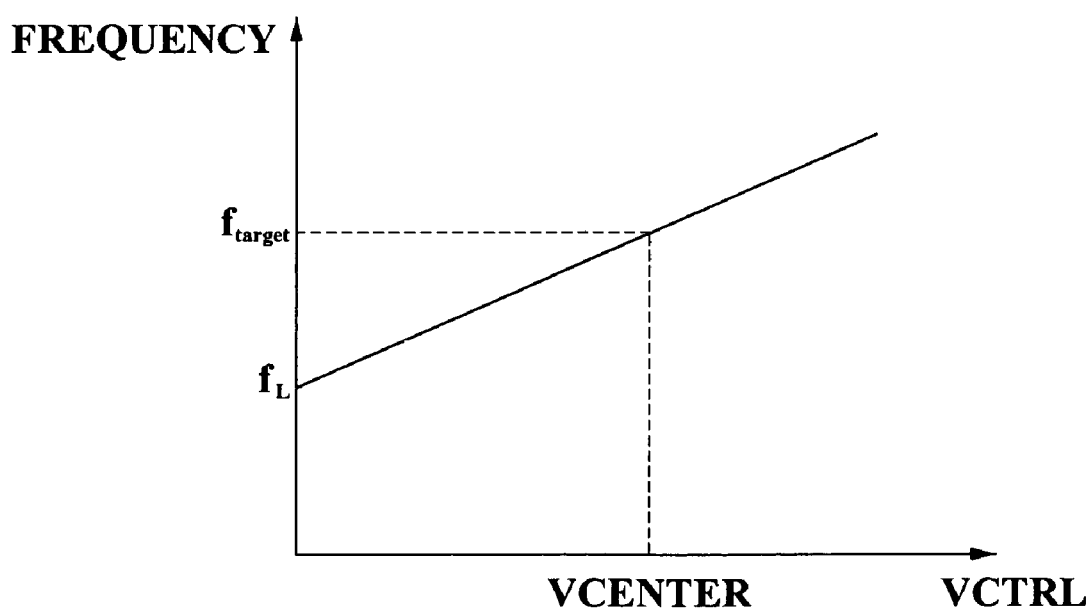
FIG. 5 is a graph illustrating an operation of tuning a target frequency in a VCO shown in FIG. 2 according to an exemplary embodiment of the present invention.

A lower edge frequency $f_L$ of a target curve as shown in FIG. 5 is determined for operation of the mode controller 240.

The lower edge frequency $f_L$ is a reference frequency which is compared with a frequency $f_{div}$ of a signal which is generated by dividing the oscillation signal LO by a natural number N. Whether to increment or decrement a band is determined depending upon whether the frequency $f_{div}$ is greater than or less than the lower edge frequency $f_L$. In this case, the oscillation-controlled voltage VCTRL of the VCO 250 must be set to "0". The lower edge frequency $f_L$ may be easily calculated from the target frequency $f_{target}$, and a slope of the target curve, i.e. a target gain. In the automatic band selection mode S310, the mode controller 240 adjusts a band-adjusted digital value DBAND, so that a frequency $f_{VCO}$ of the local signal LO becomes the lower edge frequency $f_L$. In this case, the divider 260 generates a clock signal DIV which is generated by dividing a frequency of the oscillation signal LO by the natural number N. The frequency comparator 230 compares the frequency of the clock signal DIV and a frequency $f_{REF}$ of the reference clock signal REF, and notifies the mode controller 240 of a frequency comparison result, DELTAF and UP/DN. Here, the natural number N is an integer which is generated by rounding off $f_L/f_{REF}$ to a nearest integer, and has a natural number value. As described above, in the automatic band selection mode S310, the frequency band of the oscillation signal LO is selected and set according to the band-adjusted digital value DBAND which is generated by the mode controller 240.

In the automatic gain tuning mode S320, the mode controller 240 adjusts a gain-adjusted digital value DGAIN, so that the frequency $f_{VCO}$ of the oscillation signal LO becomes the target frequency $f_{target}$. In this case, the divider 260 generates a clock signal DIV which is generated by dividing the oscillation signal LO by a natural number M. Even in this case, the frequency comparator 230 compares a frequency of the clock signal DIV and a frequency $f_{REF}$ of a reference clock signal REF, and notifies the mode controller 240 of a frequency comparison result, DELTAF and UP/DN. Here, the natural number M is an integer which is generated by rounding off $f_{target}/f_{REF}$ to a nearest integer, and has a natural number value. As described above, in the automatic gain tuning mode S320, the gain of the oscillation signal LO is selected and set according to the gain-adjusted digital value DGAIN which is generated by the mode controller 240.

In the phase-locking mode S330, the mode controller 240 bypasses a variable oscillation-controlled voltage VCTRL to the VCO 250. Here, the variable oscillation-controlled voltage VCTRL is output from the loop filter 222. The VCO 250 phase-locks the oscillation signal LO according to the bypassed variable oscillation-controlled voltage VCTRL.

The mode controller 240 may generate a mode selection signal MODE which designates each of the automatic band selection mode S310, the automatic gain tuning mode S320, and the phase-locking mode S330, from the frequency comparison result, DELTAF and UP/DN, which is output from the frequency comparator 230. Accordingly, the divider 260 divides the frequency of the oscillation signal LO by the natural number N in the automatic band selection mode S3 10, and also divides the frequency of the oscillation signal LO by the natural number M, in the automatic gain tuning mode S320 and the phase-locking mode S330.

The PFD 210 compares a phase of the reference clock signal REF and a phase of the signal DIV having a frequency divided in the divider 260. Also, the PFD 210 generates a corresponding phase difference signal. The charge pump 221 generates a charge adjustment signal corresponding to the phase difference signal. The loop filter 222 generates a controlled voltage so as to determine a frequency of the VCO 250. The controlled voltage is generated in the loop filter 222, and bypassed as the oscillation-controlled voltage VCTRL to the VCO 250 in the phase-locking mode S330. Here, the loop filter 222 is in a form of a low pass filter (LPF), and may convert a charge pump current generated from the charge pump 221, to a control voltage which changes according to the phase difference signal.

As described above, the mode controller 240 generates a signal for controlling each of the automatic band selection mode S310, the automatic gain tuning mode S320, and the phase-locking mode S330, in each of the modes S310, S320, and S330, from the frequency comparison result between the reference clock signal REF and the frequency divided clock signal DIV. Accordingly, the VCO 250 generates a corresponding oscillation signal LO in each of the automatic band selection mode S310, the automatic gain tuning mode S320, and the phase-locking mode S330. Particularly, the VCO 250 may generate the oscillation signal LO which is stably locked in the target frequency $f_{target}$, in the phase-locking mode S330.

Figure 6:
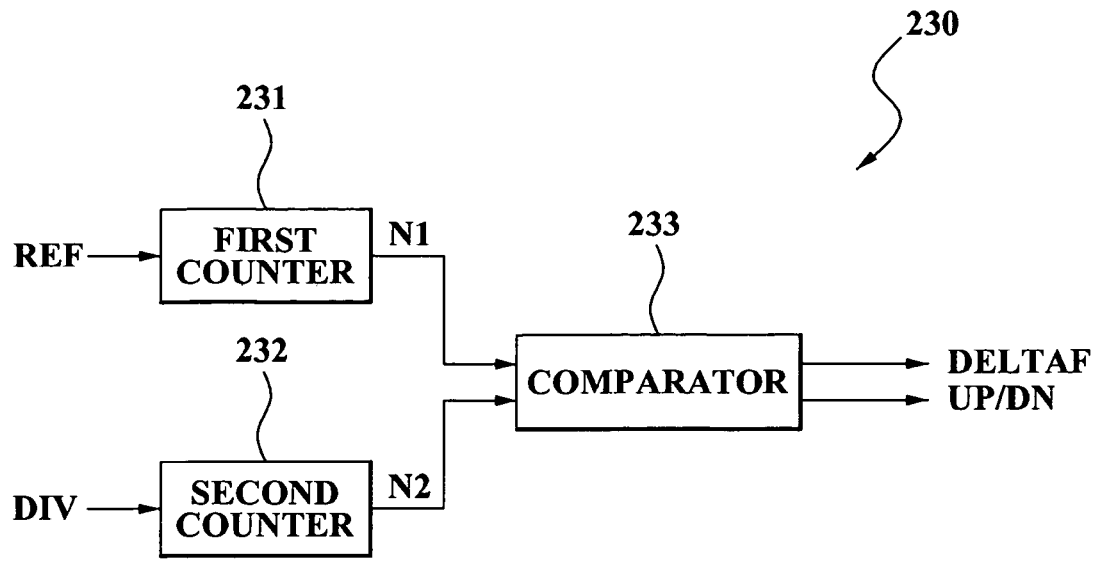
FIG. 6 is a block diagram illustrating an example of a frequency comparator shown in FIG. 2 according to an exemplary embodiment of the present invention.

FIG. 6 is a block diagram illustrating an example of the frequency comparator 230 shown in FIG. 2 according to an exemplary embodiment of the present invention. Referring to FIG. 6, the frequency comparator 230 includes a first counter 231, a second counter 232, and a comparator 233.

The first counter 231 generates a count value N1 by counting the number of pulses of the reference clock signal REF for a predetermined period. The second counter 232 generates a count value N2 by counting the number of pulses of the frequency divided signal DIV. Specifically, each of the first counter 231 and the second counter 232 generates the count values N1 and N2 respectively, by counting the number of corresponding pulses for the same period. The comparator 233 compares the count values N1 and N2.

Also, the comparator 233 generates the frequency comparison result, DELTAF and UP/DN, from the difference between the count values N1 and N2. Hereinafter, the DELTAF designates a value of the frequency comparison result, and the UP/DN designates a sign of the frequency comparison result. Specifically, the difference between the counts values N1 and N2 has a negative sign or a positive sign. The UP/DN designates the negative sign or the positive sign.

FIG. 7 is a block diagram illustrating an example of the mode controller 240 shown in FIG. 2 according to an exemplary embodiment of the present invention. Referring to FIG. 7, the mode controller 240 includes a mode determination unit 241, a switch 242, a band controller 245, and a gain controller 246. The switch 242 includes a first switch 243 and a second switch 244.

The mode determination unit 241 compares the value DELTAF of the frequency comparison result and predetermined threshold values TH1 and TH2, and generates a mode selection signal MODE. The mode selection signal MODE may be a digital value which designates each of the automatic band selection mode S310, the automatic gain tuning mode S320, and the phase-locking mode S330. As an example, when the mode selection signal MODE is "00", it may designate the automatic band selection mode S310. When the mode selection signal MODE is "01", it may designate the automatic gain tuning mode S320. Also, when the mode selection signal MODE is "10", it may designate the phase-locking mode S330.

The first switch 243 switches the sign UP/DN of the frequency comparison result to any one of a first path and a second path according to the mode selection signal MODE. The band controller 245 generates a band-adjusted digital value DBAND to adjust a frequency band of the oscillation signal LO according to the sign UP/DN of the frequency comparison result which is output to the first path. Here, the band-adjusted digital value DBAND may be output as 2, 3, 4 . . . bits. Also, as the number of bits of the band-adjusted digital value DBAND is increased, the frequency band of the oscillation signal LO may be further precisely adjusted.

The gain controller 246 generates a gain-adjusted digital value DGAIN to adjust a gain of the oscillation signal LO according to the sign UP/DN of the frequency comparison result which is output to the second path in the first switch 243. Here, the gain-adjusted digital value DGAIN may be output as 2, 3, 4 . . . bits Also, as the number of bits of the gain-adjusted digital value DGAIN is increased, the gain of the oscillation signal LO may be further precisely adjusted.

The band controller 245 and the gain controller 246 may be embodied into a predetermined logic to increment a unit value, for example, a band or a gain curve, by one when the sign UP/DN of the frequency comparison result indicates the positive sign, and to decrement the unit value, for example, the band or the gain curve, by one when the sign UP/DN of the frequency comparison result indicates the negative sign.

Also, the second switch 244 outputs any one of a first voltage, a second voltage, and an oscillation-controlled voltage, which is generated from the loop filter 222, as the oscillation-controlled voltage VCTRL of the VCO 250 according to the mode selection signal MODE. As an example, in the phase-locking mode S330, the second switch 244 bypasses the variable oscillation-controlled voltage VCTRL, which is generated from the loop filter 222, to the VCO 250, so that the VCO 250 phase-locks the oscillation signal LO to the target frequency $f_{target}$ according to the bypassed variable oscillation-controlled voltage VCTRL. In the automatic band selection mode S310, the second switch 244 outputs a ground, i.e. 0 volts, as the oscillation-controlled voltage VCTRL of the VCO 250. Also, in the automatic gain tuning mode S320, the second switch 244 outputs the central voltage VCENTER of the swing range of the VCO 250 as the oscillation-controlled voltage VCTRL of the VCO 250.

According to a configuration of the mode controller 240 as described above, the mode determination unit 241 generates the mode selection signal MODE which designates the automatic band selection mode S310, for example, in an initial stage after a power-on. In the automatic band selection mode S310, the mode determination unit 241 compares the value DELTAF of the frequency comparison result with a first threshold value TH1. Also, the mode determination unit 241 controls the band controller 245 to increment or decrement the band-adjusted digital value DBAND. Accordingly, when the value DELTAF of the frequency comparison result is less than the first threshold value TH1, the mode determination unit 241 changes to the automatic gain tuning mode S320. The frequency band of the VCO 250 is selected and set according to the band-adjusted digital value DBAND right before the mode determination unit 241 changes to the automatic gain tuning mode S320. As described above, the frequency band of the VCO 250, which is set in the automatic band selection mode S310, is maintained until the mode determination unit 241 changes from another mode to the automatic band selection mode S310.

When the mode determination unit 241 changes to the automatic gain tuning mode S320, the mode determination unit 241 compares the value DELTAF of the frequency comparison result with a second threshold value TH2. Also, the mode determination unit 241 controls the gain controller 246 to increment or decrement the gain-adjusted digital value DGAIN. Accordingly, when the value DELTAF of the frequency comparison result is less than the second threshold value TH2, the mode determination mode 241 changes to the phase-locking mode S330. The gain of the VCO 250 is selected and set according to the gain-adjusted digital value DGAIN right before the mode determination unit 241 changes to the phase-locking mode S330. As described above, the gain of the VCO 250 which is set in the automatic gain tuning mode S320 is maintained until the mode determination unit 241 changes from another mode to the automatic gain tuning mode S320.

When the mode determination unit 241 changes to the phase-locking mode S330, the variable oscillation-controlled voltage VCTRL, which is generated from the loop filter 222, is bypassed to the VCO 250. The VCO 250 phase-locks the oscillation signal LO to the target frequency $f_{target}$ according to the bypassed variable oscillation-controlled voltage VCTRL.

Figure 8:
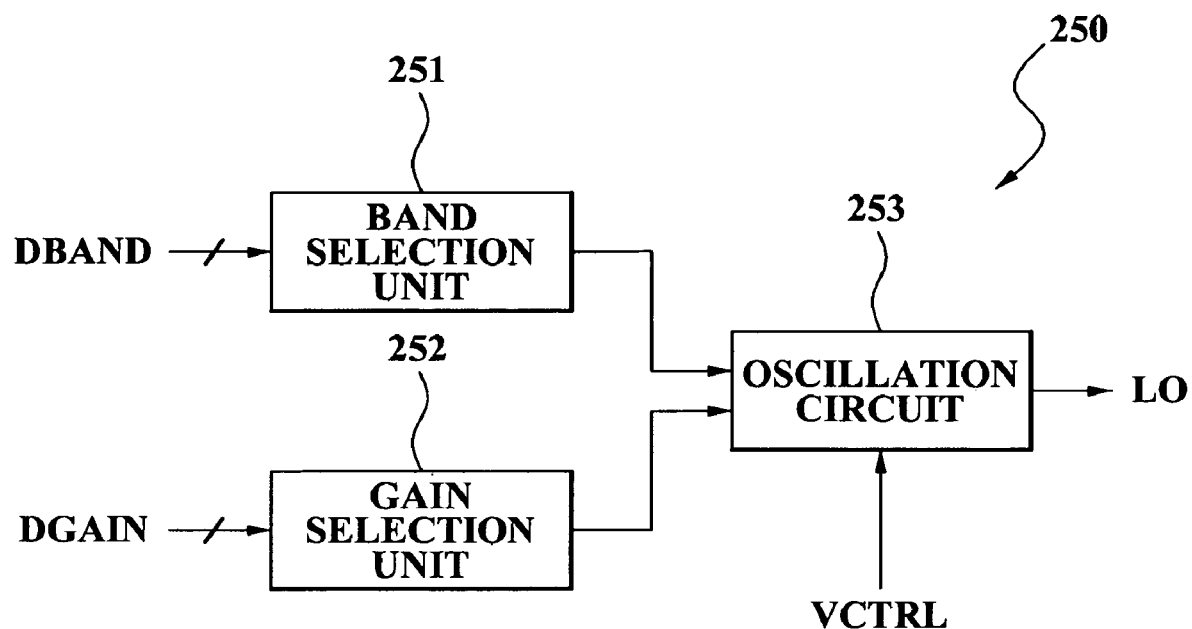
FIG. 8 is a diagram illustrating an example of a VCO shown in FIG. 2 according to an exemplary embodiment of the present invention.

FIG. 8 is a diagram illustrating an example of the VCO 250 shown in FIG. 2 according to an exemplary embodiment of the present invention. Referring to FIG. 8, the VCO 250 includes a band selection unit 251, a gain selection unit 252, and an oscillation circuit 253.

The band selection unit 251 selects the frequency band of the oscillation signal LO according to the band-adjusted digital value DBAND which is generated from the band controller 245 of FIG. 7.

The gain selection unit 252 selects the gain of the oscillation signal LO according to the gain-adjusted digital value DGAIN which is generated from the gain controller 246 of FIG. 7.

The oscillation circuit 253 generates the oscillation signal LO which is oscillated at a certain frequency according to the oscillation-controlled voltage VCTRL which is output from the second switch 244, in a frequency band selected by the band selection unit 251 and a gain range selected by the gain selection unit 252.

As an example, the band selection unit 251 selects any one of the plurality of bands 410, 420, 430, 440, . . . , which are shown in FIG. 4. The gain selection unit 252 selects a gain, which has a target curve characteristic as shown in FIG. 5, from curves of the band selected by the band selection unit 251. As the second switch 244 bypasses an output of the loop filter 222 to the VCO 250, the oscillation signal LO, which has the target frequency $f_{target}$ in the central voltage VCENTER of the swing range of the oscillation-controlled voltage VCTRL of the VCO 250, may be generated.

Hereinafter, the automatic band selection mode S310 and the automatic gain tuning mode S320 of the PLL system 200 shown in FIG. 2 will be further described in detail with reference to FIGS. 9 and 10.

Figure 9:
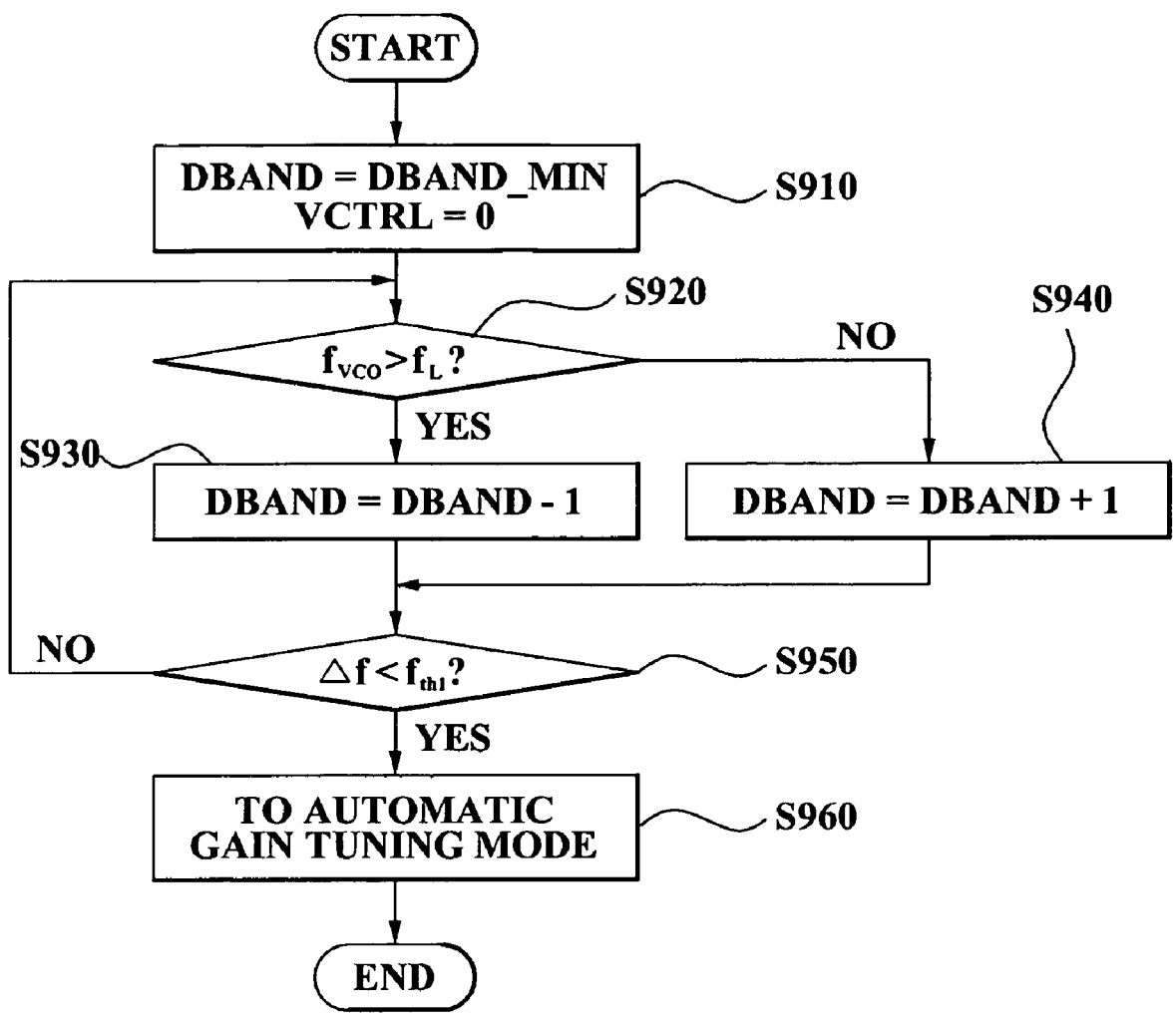
FIG. 9 is a flowchart illustrating a process of operating an automatic band selection mode in a PLL system shown in FIG. 2 according to an exemplary embodiment of the present invention.

FIG. 9 is a flowchart illustrating a process of operating the automatic band selection mode S310 and the automatic gain tuning mode S320 in the PLL system 200 shown in FIG. 2 according to an exemplary embodiment of the present invention.

The PLL system 200 operates in the automatic band selection mode S310 during an initial stage after a power-on. In this case, in operation S910, the frequency band of the VCO 250 is set to have a minimal value, for example, a band value of the band 410 of FIG. 4. Also, the oscillation-controlled voltage VCTRL of the VCO 250 is set to 0 volts. The minimal value DBAND_MIN of the frequency band of the VCO 250 may be set to the minimal value, for example, 0, that the band-adjusted digital value DBAND may have in FIG. 7.

In operation S920, the frequency $f_{VCO}$ of the oscillation signal LO is compared with the lower edge frequency $f_L$ of the target curve, which is described with FIG. 5. In operations S930 and S940, when the frequency $f_{VCO}$ of the oscillation signal LO is greater than the lower edge frequency $f_L$, the frequency band of the VCO 250 is decremented, and otherwise, the frequency band of the VCO 250 is incremented.

As described with FIG. 7, operations S920 through S940 may be embodied by the band controller 245 incrementing or decrementing the band-adjusted digital value DBAND.

In operation S950, a frequency difference $\Delta f$ between the frequency $f_{VCO}$ of the oscillation signal LO and the lower edge frequency $f_L$ is compared with a predetermined value $f_{th1}$. In this case, when the frequency difference $\Delta f$ is not less than the predetermined value $f_{th1}$, the above-described process will be repeated. Also, when the frequency difference $\Delta f$ is less than the predetermined value $f_{th1}$, the mode determination unit 241 changes to the automatic gain tuning mode S320 in operation S960.

Specifically, operations S950 and S960 may be embodied by the mode determination unit 241 comparing the value DELTAF of the frequency comparison result and the first threshold value TH1, and changing to the automatic gain tuning mode S320 when the value DELTAF of the frequency comparison result is less than the first threshold value TH1.

In this case, as described with FIG. 2, a clock signal which is generated by dividing a frequency of the oscillation signal LO by a predetermined value N is utilized for acquiring the frequency $f_{VCO}$ of the oscillation signal LO.

Figure 10:
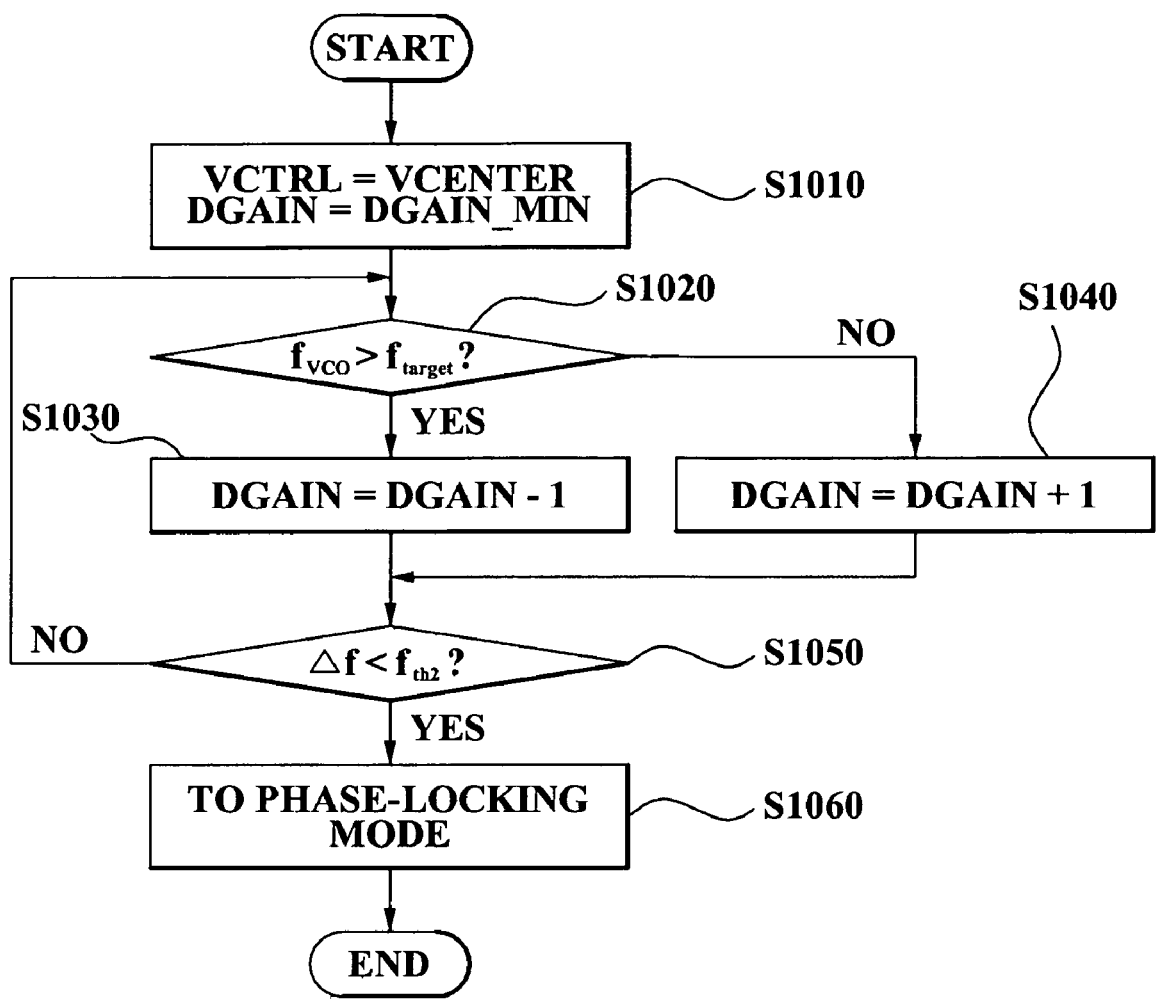
FIG. 10 is a flowchart illustrating a process of operating an automatic gain tuning mode in a PLL system shown in FIG. 2 according to an exemplary embodiment of the present invention.

FIG. 10 is a flowchart illustrating a process of operating the automatic gain tuning mode S320 in the PLL system 200 shown in FIG. 2 according to an exemplary embodiment of the present invention.

When changed to the automatic gain tuning mode S320 by the process of FIG. 9, the PLL system 200 operates to tune the gain of the VCO 250 in a selected band range. In the present exemplary embodiment, in operation S1010, the gain of the VCO 250 is set to have a minimal value, for example, a gain of a curve having a smallest slope among curves of any one band of the plurality of bands 410, 420, 430, 440, . . . , as shown in FIG. 4. Also, the oscillation-controlled voltage VCTRL of the VCO 250 is set to VCENTER. It will be the same as to set the minimal value DGAIN_MIN of the gain of the VCO to the minimal value, for example, 0, that the gain-controlled digital value DGAIN may have in FIG. 7.

In operation S1020, the frequency $f_{VCO}$ of the oscillation signal LO is compared with the target frequency $f_{target}$, which are described with FIG. 5. In operations S1030 and S1040, when the frequency $f_{VCO}$ of the oscillation signal LO is greater than the target frequency $f_{target}$, the gain of the VCO 250 is decremented, otherwise the gain of the VCO 250 is incremented.

As described with FIG. 7, operations S1020 through S1040 may be embodied by the gain controller 246 incrementing or decrementing the gain-adjusted digital value DGAIN.

In operation S1050, a frequency difference $\Delta f$ between the frequency $f_{VCO}$ of the oscillation signal LO and the target frequency $f_{target}$ is compared with a predetermined value $f_{th2}$. In this case, when the frequency difference $\Delta f$ is not less than the predetermined value $f_{th2}$, the above-described process will be repeated. Also, when the frequency difference $\Delta f$ is less than the predetermined value $f_{th2}$, the mode determination unit 241 changes to the phase-locking mode S330 in operation S1060.

Specifically, operations S1050 and S1060 may be embodied by the mode determination unit 241 comparing the value DELTAF of the frequency comparison result and the second threshold value TH2, and changing to the phase-locking mode S330 when the value DELTAF of the frequency comparison result is less than the second threshold value TH2.

In this case, as described with FIG. 2, a clock signal which is generated by dividing a frequency of the oscillation signal LO by a predetermined value M, is utilized for acquiring the frequency $f_{VCO}$ of the oscillation signal LO.

In the phase-locking mode S330, the VCO 250 phase-locks the oscillation signal LO to the target frequency $f_{target}$ in the tuned gain range.

FIG. 11 is a block diagram illustrating an example of the mode controller 1100 according to another example of the present invention. Referring to FIG. 11, the mode controller 1100 includes a counter 1110, a switch 1120, a band controller 1150, and a gain controller 1160. The switch 1120 includes a first switch 1130 and a second switch 1140.

The counter 1110 generates a mode selection signal MODE by comparing a count value of pulses of a predetermined clock signal CLK with predetermined periods TTH1 and TTH2, and thereby, determining whether to maintain the automatic band selection mode S310 or whether to change from the automatic band selection mode S310 to the automatic gain tuning mode S320 or to the phase-locking mode S330. The mode controller 1100 operates to be similar to the mode controller 240 of FIG. 7 except for the mode selection signal MODE which is generated in the counter 1110.

Specifically, the mode selection signal MODE may be a digital value which designates each of the automatic band selection mode S310, the automatic gain tuning mode S320, and the phase-locking mode S330. As an example, when the mode selection signal MODE is "00", it may designate the automatic band selection mode S310. Also, when the mode selection signal MODE is "01", it may designate the automatic gain tuning mode S320. When the mode selection signal MODE is "10", it may designate the phase-locking mode S330.

The switch 1120, the band controller 1150, and the gain controller 1160 may operate to be similar to the switch 242, the band controller 245, and the gain controller 246 which are described with FIG. 7.

According to a configuration of the mode controller 1100 as described above, the counter 1110 generates the mode selection signal MODE which designates the automatic band selection mode S310, for example, in an initial stage after a power-on. In the automatic band selection mode S310, the counter 1110 compares a count value which is acquired after starting adjusting a frequency band of the VCO 250, with a first period TTH1. Also, the counter 1110 controls the band controller 1150 to increment or decrement the band-adjusted digital value DBAND. The first period TTH1 may be set to a significantly long enough period of time for an operating frequency band of the VCO 250 to reach a target band. When the count value reaches the first period TTH1, the counter 1110 changes to the automatic gain tuning mode S320. The frequency band of the VCO 250 is selected and set according to the band-adjusted digital value DBAND right before the counter 1110 changes to the automatic gain tuning mode S320. As described above, the frequency band of the VCO 250 which is set in the automatic band selection mode S310 is maintained until the counter 1110 changes from another mode to the automatic band selection mode S310.

Also, when the counter 1110 changes to the automatic gain tuning mode S320, the counter 1110 compares a count value which is acquired after starting tuning the gain of the VCO 250, with a second period TTH2. Also, the counter 1110 controls the gain controller 1160 to increment or decrement the gain-adjusted digital value DGAIN. The second period TTH2 may be set to a significantly long enough period of time for the gain of the VCO 250 to reach a target gain. When the count value reaches the second period TTH2, the counter 1110 changes to the phase-locking mode S330. The gain of the VCO 250 is selected and set according to the gain-adjusted digital value DGAIN right before the counter 1110 changes to the gain-adjusted digital value DGAIN. As described above, the gain of the VCO 250 which is set in the automatic gain tuning mode S320 is maintained until the counter 1110 changes from another mode to the automatic gain tuning mode S320.

When the counter 1110 changes to the phase-locking mode S330, the variable oscillation-controlled voltage VCTRL, which is generated from the loop filter 222, is bypassed to the VCO 250. The VCO 250 phase-locks the oscillation signal LO to the target frequency $f_{target}$ according to the bypassed variable oscillation-controlled voltage VCTRL.

Figure 12:
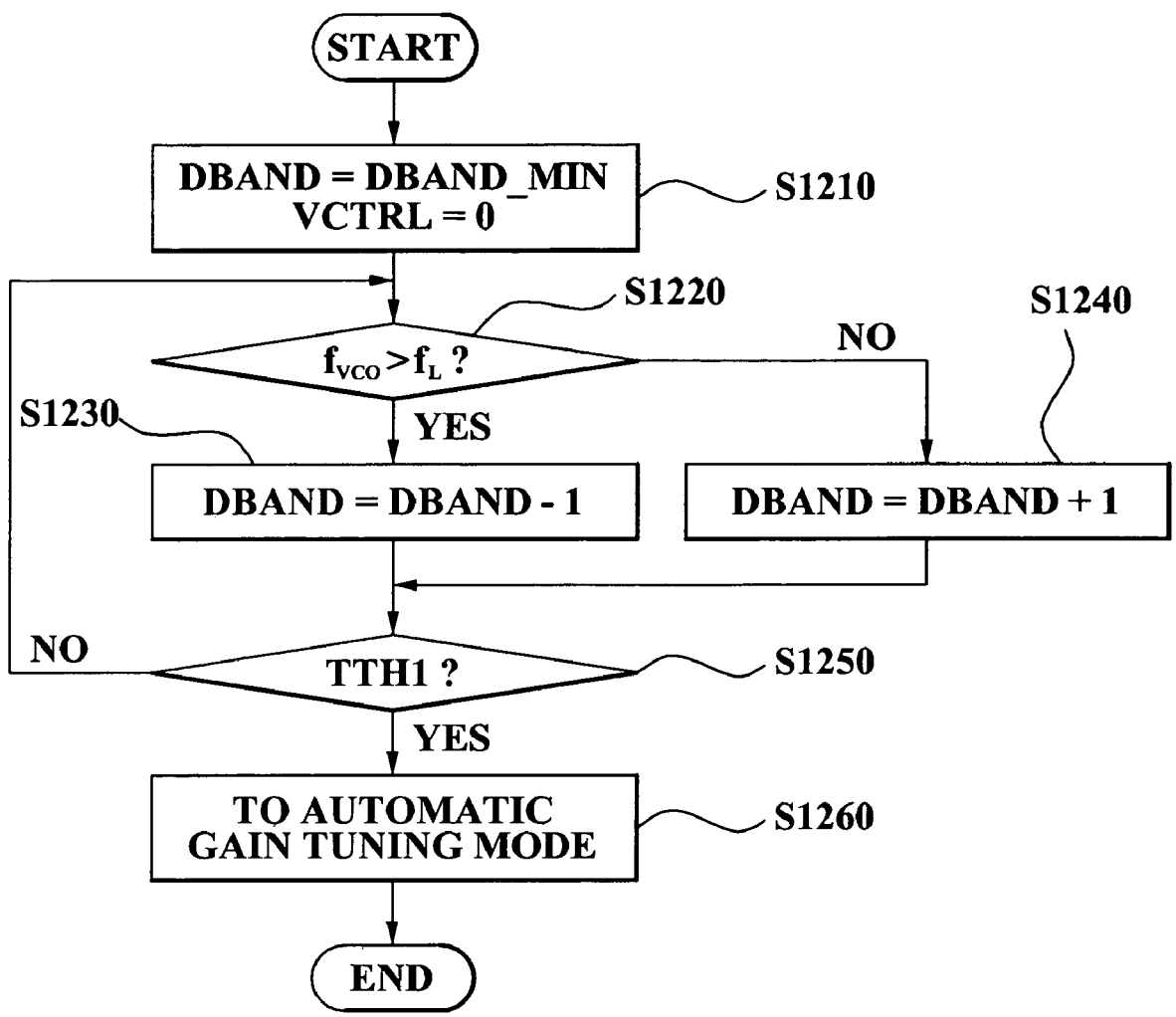
FIG. 12 is a flowchart illustrating a process of operating an automatic band selection mode when applying a mode controller shown in FIG. 11 according to an exemplary embodiment of the present invention.

FIG. 12 is a flowchart illustrating a process of operating the automatic band selection mode S310 when applying the mode controller 1100 shown in FIG. 11 according to an exemplary embodiment of the present invention In operation S1210, the PLL system 200 operates in the automatic band selection mode S310 during an initial stage after a power-on, which is similar to the description of FIG. 10. In this case, the frequency band of the VCO 250 is set to have a minimal value, for example, a band value of the band 410 of FIG. 4. Also, the oscillation-controlled voltage VCTRL of the VCO 250 is set to 0 volts. The minimal value DBAND_MIN of the frequency band of the VCO 250 may be set to the minimal value, for example, 0, that the band-adjusted digital value DBAND may have in FIG. 7.

In operation S1220, the frequency $f_{VCO}$ of the oscillation signal LO is compared with the lower edge frequency $f_L$ of the target curve, which is described with FIG. 5. In operations S1230 and S1240, when the frequency $f_{VCO}$ of the oscillation signal LO is greater than the lower edge frequency $f_L$, the frequency band of the VCO 250 is decremented, and otherwise, the frequency band of the VCO 250 is incremented.

As described with FIG. 7, operations S1220 through S1240 may be embodied by the band controller 1150 incrementing or decrementing the band-adjusted digital value DBAND.

In operation S1250, it is determined whether the first period TTH1 has elapsed after starting adjusting the frequency band. In this case, when the first period TTH1 did not elapse, the above-described process will be repeated. Also, when the first period TTH1 elapsed, the counter 1110 changes to the automatic gain tuning mode S320 in operation S1260.

Specifically, operations S1250 and S1260 may be embodied by the counter 1110 comparing a count value of pulses of a predetermined clock signal CLK with the first period TTH1, and changing to the automatic gain tuning mode S320, when the count value reaches the first period TTH1.

In this case, as described with FIG. 2, a clock signal which is generated by dividing a frequency of the oscillation signal LO by a predetermined value N is utilized for acquiring the frequency $f_{VCO}$ of the oscillation signal LO.

Figure 13:
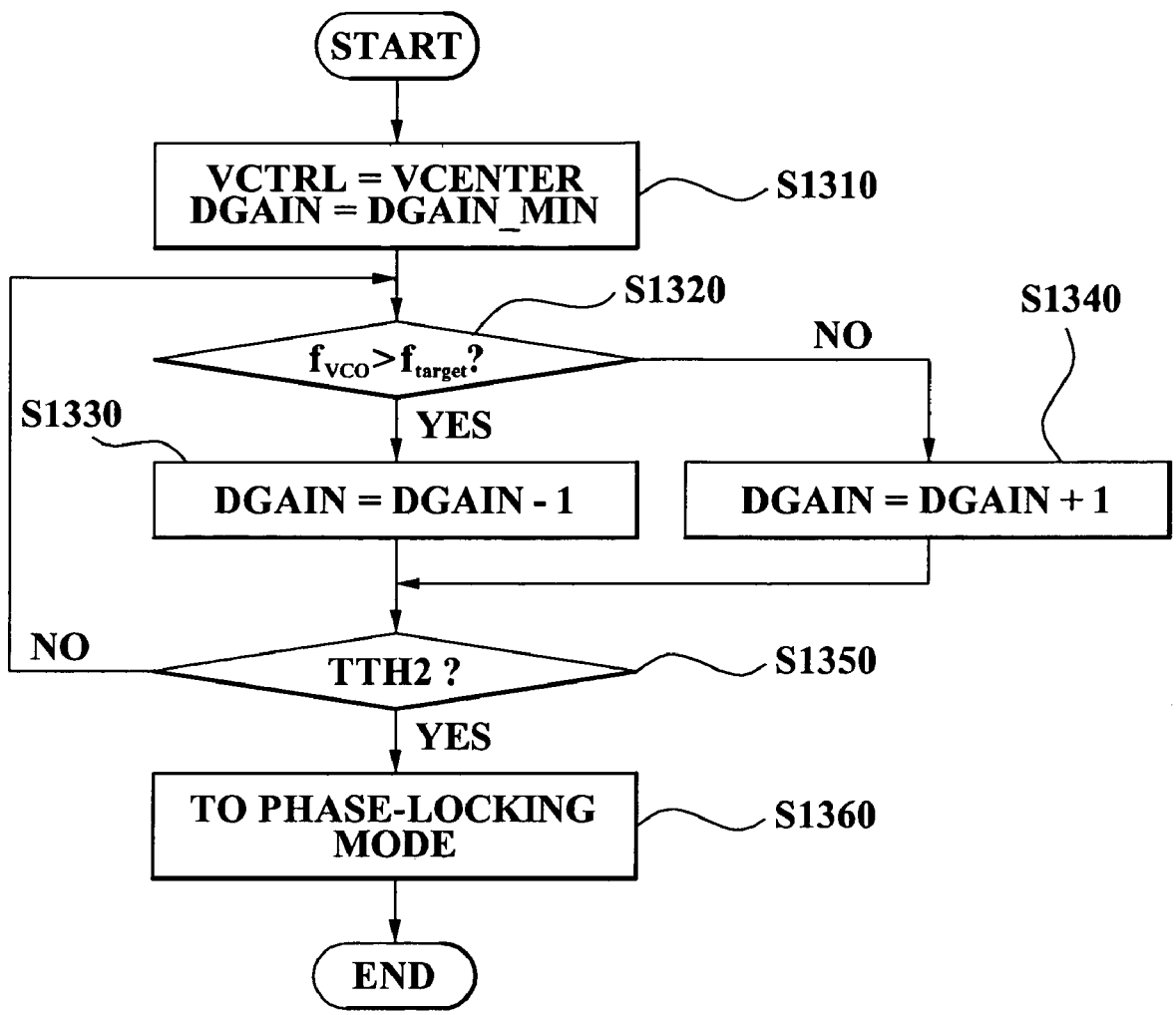
FIG. 13 is a flowchart illustrating a process of operating an automatic gain tuning mode when applying a mode controller shown in FIG. 11 according to an exemplary embodiment of the present invention.

FIG. 13 is a flowchart illustrating a process of operating the automatic gain tuning mode S320 when applying the mode controller 1100 shown in FIG. 11 according to an exemplary embodiment of the present invention.

When changed to the automatic gain tuning mode S320 by the process of FIG. 12, the PLL system 200 operates to tune the gain of the VCO 250 in a selected band range. In the present exemplary embodiment, in operation S1310, the gain of the VCO 250 is set to have a minimal value, for example, a gain of a curve having a smallest slope among curves of any one band of the plurality of bands 410, 420, 430, 440, . . . , as shown in FIG. 4. Also, the oscillation-controlled voltage VCTRL of the VCO 250 is set to VCENTER. It will be the same as to set the minimal value DGAIN_MIN of the gain of the VCO 250 to the minimal value, for example, 0, that the gain-controlled digital value DGAIN may have in FIG. 7.

In operation S1320, the frequency $f_{VCO}$ of the oscillation signal LO is compared with the target frequency $f_{target}$, which is described with FIG. 5. In operations S1330 and S1340, when the frequency $f_{VCO}$ of the oscillation signal LO is greater than the target frequency $f_{target}$, the gain of the VCO 250 is decremented, and otherwise, the gain of the VCO 250 is incremented.

As described with FIG. 7, operations S1320 through S1340 may be embodied by the gain controller 1150 incrementing or decrementing the gain-adjusted digital value DGAIN.

In operation S1350, it is determined whether the second period TTH2 has elapsed after starting adjusting the gain. In this case, when the second TTH2 did not elapse, the above-described process will be repeated. Also, when the second period TTH2 elapsed, the PLL system 200 the counter 1110 changes to the phase-locking mode S330 in operation S1360.

Specifically, operations S1350 and S1360 may be embodied by the counter 1110 comparing a count value of pulses of a predetermined clock signal CLK with the second period TTH2, and changing to the automatic gain tuning mode S320, when the count value reaches the second period TTH2.

In this case, as described with FIG. 2, a clock signal which is generated by dividing a frequency of the oscillation signal LO by a predetermined value M is utilized for acquiring the frequency $f_{VCO}$ of the oscillation signal LO.

In the phase-locking mode S330, the VCO 250 phase-locks the oscillation signal LO to the target frequency $f_{target}$ in the tuned gain range.

As described above, in the PLL system 200 according to an exemplary embodiment of the present invention, when the mode controller 240 or 1100 generates a control signal for each of the automatic band selection mode S310, the automatic gain tuning mode S320, and the phase-locking mode S330, from the reference clock signal REF and the frequency comparison result of the frequency divided signal DIV which is generated from the divider 260, the VCO 250 may generate the oscillation signal LO which is phase-locked in the target frequency $f_{target}$ with an optimal state according to the control signal.

Also, in a PLL system according to the present invention, a frequency band and a gain of an oscillation signal are systematically adjusted, and a phase-locking of the oscillation signal is secured. Accordingly, it is possible to apply the PLL system to a manufacturing process of a circuit or an operating temperature of the circuit, so as to generate a stable oscillation signal in a broadband application. Also, the PLL system according to the present invention may improve a system performance in a wireless communication system, such as a mobile phone, a DBM phone, and a PDA.

The invention can also be embodied as computer-readable codes on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, optical data storage devices, and carrier waves, such as data transmission through the Internet. The computer-readable recording medium can also be distributed over network coupled computer systems so that the computer-readable code is stored and executed in a distributed fashion.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A system for generating an oscillation signal, the system comprising:
    a voltage-controlled oscillator (VCO) which generates first to third oscillation signals according to first to third control signals of an automatic band selection mode, an automatic gain tuning mode, and a phase-locking mode, respectively, with respect to the VCO; and
    a mode controller which generates:
    the first control signal from a first frequency comparison result between a reference signal and a first feedback signal generated by dividing a frequency of an initial oscillation signal of the VCO by a first number, to control the VCO to generate the first oscillation signal in the automatic band selection mode;
    the second control signal from a second frequency comparison result between the reference signal and a second feedback signal generated by dividing a frequency of the first oscillation signal by a second number, to control the VCO to generate the second oscillation signal in the automatic gain tuning mode; and
    the third control signal to control the VCO to generate the third oscillation signal which is phase-locked in the phase-locking mode,
    wherein the mode controller comprises:
    a first switch which provides signs of the first or second frequency comparison result to a first or second path, respectively, according to a mode selection signal selecting one of the automatic band selection mode, the automatic gain tuning mode and the phase-locking mode;
    a second switch which outputs one of a first voltage, a second voltage or an oscillation-controlled voltage to the VCO, respectively, according to the mode selection signal;
    a band controller which generates the first control signal to select an operating frequency band of the VCO according to the sign of the first frequency comparison result which is output to the first path; and
    a gain controller which generates the second control signal to select a target gain range of the VCO according to the sign of the second frequency comparison result which is output to the second path.

2. The system of claim 1, further comprising a loop filter disposed upstream of the mode controller, wherein the third oscillation signal is phase-locked in the phase-locking mode as the mode controller bypasses a variable oscillation-controlled voltage output from the loop filter of the system to the VCO.

3. The system of claim 1, further comprising:
    a frequency comparator which compares a frequency of the reference signal with frequencies of the first and second feedback signals to generate the first and second frequency comparison results, respectively.

4. The system of claim 3, wherein the frequency comparator comprises:
    a first counter which generates a first pulse count value with respect to the reference signal;
    a second counter which generates second and third pulse count values with respect to the first and second feedback signals, respectively; and
    a comparator which generates the first and second frequency comparison results from a difference between the first pulse count value and the second pulse count value and a difference between the first pulse count value and the third pulse count value, respectively.

5. The system of claim 1, wherein the mode controller further comprises:
a mode determination unit which compares values of the first and second frequency comparison results with first and second threshold values, respectively, to generate the mode selection signal.

6. The system of claim 5, wherein:
the band controller selects the operating frequency band of the VCO in the automatic band selection mode and changes the system to the automatic gain tuning mode, if the value of the first frequency comparison result is less than the first threshold value,
the gain controller selects the target gain range of the VCO in the automatic gain tuning mode and changes the system to the phase-locking mode, if the value of the second frequency comparison result is less than the second threshold value, and
the third oscillation signal is phase-locked in the phase-locking mode as the second switch bypasses the oscillation-controlled voltage to the VCO.

7. The system of claim 1, further comprising:
a counter which compares first and second count values of pulses of a clock signal and first and second periods to generate the mode selection signal.

8. The system of claim 7, wherein:
the band controller selects the operating frequency band of the VCO in the automatic band selection mode, when the first count value is greater than the first period,
the gain controller selects the target gain range of the VCO in the automatic gain tuning mode, when the second count value is greater than the second period, and
the third oscillation signal is phase-locked in the phase-locking mode as the second switch bypasses the oscillation-controlled voltage to the VCO.

9. The system of claim 1, wherein the first voltage is 0 volt, and the second voltage corresponds to a central voltage of the target gain range of the oscillation-controlled voltage.

10. The system of claim 6, wherein if the value of the first frequency comparison result is not less than the first threshold value, the system does not change from the automatic band selection mode, in which the operating frequency band is selected, to the automatic gain tuning mode in which the gain of the VCO is set, and
wherein if the value of the second frequency comparison result is not less than the second threshold value, the system does not change from the automatic gain tuning mode, in which the target gain range of the VCO is selected, to the phase-locking mode in which the third oscillation signal is phase-locked.

11. The system of claim 8, wherein if the first count value is not greater than the first period, the system does not change from the automatic band selection mode, in which the operating frequency band is selected, to the automatic gain tuning mode in which the gain of the VCO is set, and
wherein if the second count value is not greater than the second period, the system does not change from the automatic gain tuning mode, in which the target gain range of the VCO is selected, to the phase-locking mode in which the third oscillation signal is phase-locked.

12. The system of claim 8, wherein the first count value is a value acquired after starting adjusting the frequency band of the first oscillation signal, and the second count value is a value acquired after staffing adjusting the gain of the second oscillation signal.

13. A system for generating an oscillation signal, the system comprising:
a voltage-controlled oscillator (VCO) which generates the oscillation signal corresponding to an oscillation-controlled voltage, in a frequency band which is selected according to a band-adjusted digital value, and a gain range which is selected according to a gain-adjusted digital value;
a mode determination unit which compares values of first and second frequency comparison results with first and second predetermined threshold values to generate a mode selection signal, from the first and second frequency comparison results between a reference signal and a first feedback signal, which is generated by dividing a frequency of an initial oscillation signal of the VCO by a first number, and the reference signal and a second feedback signal which is generated by dividing a frequency of a first oscillation signal of the VCO in the selected frequency band by a second number;
a switch which provides signs of the first and second frequency comparison results to first and second paths according to the mode selection signal, and outputs one of a first voltage, a second voltage, and a phase-locked loop (PLL) based variable voltage, as the oscillation-controlled voltage, according to the mode selection signal;
a band controller which generates the band-adjusted digital value according to the sign of the first frequency comparison result which is output to the first path; and
a gain controller which generates the gain-adjusted digital value according to the sign of the second frequency comparison result which is output to the second path.

14. A system for generating an oscillation signal, the system comprising:
a voltage-controlled oscillator (VCO) which generates the oscillation signal corresponding to an oscillation-controlled voltage, in a frequency band which is selected according to a band-adjusted digital value, and a gain range which is selected according to a gain-adjusted digital value;
a counter which compares first and second count values of pulses of a predetermined clock signal with first and second predetermined periods to generate a mode selection signal;
a switch which provides signs of first and second frequency comparison results between a reference signal and a first feedback signal, which is generated by dividing a frequency of an initial oscillation signal of the VCO by a first number, and the reference signal and a second feedback signal which is generated by dividing a frequency of a first oscillation signal of the VCO in the selected frequency band by a second number, to first and second paths according to the mode selection signal, and outputs one of a first voltage, a second voltage, and a phase-locked loop (PLL) based variable voltage, as the oscillation-controlled voltage, according to the mode selection signal;
a band controller which generates the band-adjusted digital value according to the sign of the first frequency comparison result which is output to the first path; and
a gain controller which generates the gain-adjusted digital value according to the sign of the second frequency comparison result which is output to the second path.

15. A method of generating an oscillation signal corresponding to an oscillation-controlled voltage from a voltage-controlled oscillator (VCO), the method comprising:

providing signs of first and second frequency comparison results to one of first and second oaths according to a mode selection signal;
outputting one of a first voltage, a second voltage, and a phase-locked loop (PLL) based variable voltage, as the oscillation-controlled voltage, according to the mode selection signal;
selecting an operating frequency band of the voltage-controlled oscillator;
tuning a gain range of the VCO in the selected operating frequency band to generate an output oscillation signal; and
phase-locking the output oscillation signal in the tuned gain range,
wherein the selecting the operating frequency band comprises:
comparing a first feedback value corresponding to a frequency of an initial oscillation signal of the VCO and a lower edge frequency of a target frequency curve of the VCO to output the first frequency comparison result;
adjusting a frequency band of the VCO according to the first frequency comparison result to obtain the selected operating frequency band; and
changing to an operation of the tuning the gain range if a difference between the first feedback value and the lower edge frequency is less than a certain level according to the adjusting the frequency band, or if a predetermined time elapses after starting adjusting the frequency band, and
wherein the tuning comprises:
comparing a second feedback value corresponding to a frequency of a first oscillation signal in the selected operating frequency band and a target frequency in the target frequency curve of the VCO to output a the second frequency comparison result;
adjusting a gain of the first oscillation signal according to the second frequency comparison result to generate the output oscillation signal; and
changing to an operation of the phase-locking the output oscillation signal if a difference between a frequency of the output oscillation signal and the target frequency is less than a certain level according to the adjusting the gain, or when a predetermined time elapses after starting adjusting the gain.

16. The method of claim 15, wherein the first feedback value is generated by dividing the frequency of the initial oscillation signal by a first number.

17. The method of claim 15, wherein the second feedback value is generated by dividing the frequency of the first oscillation signal by a second number.

18. A method of generating an oscillation signal corresponding to an oscillation-controlled voltage using a voltage-controlled oscillator (VCO) in a frequency band which is selected according to a band-adjusted digital value, and a gain range which is selected according to a gain-adjusted digital value, the method comprising:
comparing values of first and second frequency comparison results with first and second predetermined thresholds to generate a mode selection signal, from the first and second frequency comparison results between a reference signal and a first feedback signal, which is generated by dividing a frequency of an initial oscillation signal of the VCO by a first number, and the reference signal and a second feedback signal which is generated by dividing a frequency of a first oscillation signal of the VCO in the selected frequency band by a second number;
providing signs of the first and second frequency comparison results to one of first and second paths according to the mode selection signal;
outputting one of a first voltage, a second voltage, and a phase-locked loop (PLL) based variable voltage, as the oscillation-controlled voltage, according to the mode selection signal;
generating the band-adjusted digital value according to the sign of the first frequency comparison result which is output to the first path; and
generating the gain-adjusted digital value according to the sign of the second frequency comparison result which is output to the second path.

19. A method of generating an oscillation signal corresponding to an oscillation-controlled voltage using a voltage-controlled oscillator (VCO) in a frequency band which is selected by a band-adjusted digital value and a gain range which is selected according to a gain-adjusted digital value, the method comprising:
comparing first and second count values of pulses of a predetermined clock signal with first and second predetermined periods, and generating a mode selection signal;
providing signs of first and second frequency comparison results between a reference signal and a first feedback signal, which is generated by dividing a frequency of an initial oscillation signal of the VCO by a first number and the reference signal and a second feedback signal which is generated by dividing a frequency of a first oscillation signal of the VCO in the selected frequency band by a second number, to first and second paths according to the mode selection signal;
outputting one of a first voltage, a second voltage, and a phase-locked loop (PLL) based variable voltage, as the oscillation-controlled voltage, according to the mode selection signal;
generating the band-adjusted digital value according to the sign of the first frequency comparison result which is output to the first path; and
generating the gain-adjusted digital value according to the sign of the second frequency comparison result which is output to the second path.

20. A system for generating an oscillation signal, the system comprising:
a voltage-controlled oscillator (VCO) which generates a plurality of oscillation signals corresponding to an oscillation-controlled voltage;
a frequency comparator that compares a first feedback value corresponding to a frequency of an initial oscillation signal of the VCO and a lower edge frequency of a target frequency curve of the VCO and a second feedback value corresponding to a frequency of a first oscillation signal in the selected operating frequency band and a target frequency of a target gain range;
a switch which provides signs of first and second frequency comparison results to first and second oaths according to a mode selection signal, and outputs one of a first voltage, a second voltage, and a phase-locked loon (PLL) based variable voltage, as the oscillation-controlled voltage, according to the mode selection signal; and
a mode controller that selects an operating frequency band of the VCO by adjusting a frequency band of the VCO according to the first frequency comparison result which is output to the first oath, and enables the system to tune a gain range of the VCO in the selected operating frequency band if a difference between the first feedback value and the lower edge frequency is less than a certain level according to the adjustment of the frequency band, or when a predetermined time elapses after starting adjusting the frequency band, wherein the VCO phase-locks an output oscillation signal in the tuned gain range corresponding to the target gain range, and wherein the mode controller further performs:
adjusting a gain of the first oscillation signal according to the second frequency comparison result which is output to the second path; and
enabling the VCO to phase-lock the output oscillation signal when a difference between the frequency of the output oscillation signal and the target frequency is less than a certain level according to an adjustment of the gain, or when a predetermined time elapses after starting adjusting the gain.

* * * * *